Sept. 10, 1968 H. WEINSTEIN 3,401,320

POSITIVE PULSE TURN-OFF CONTROLLED RECTIFIER

Filed May 12, 1966

INVENTOR.
HAROLD WEINSTEIN

BY

OSTROLENK, FABER, GERB & SOFFEN

ATTORNEYS 3,401,320
POSITIVE PULSE TURN-OFF CONTROLLED RECTIFIER

Harold Weinstein, Van Nuys, Calif., assignor to International Rectifier Corporation, El Segundo, Calif., a corporation of California Filed May 12, 1966, Ser. No. 549,695
3 Claims. (Cl. 317—235)

ABSTRACT OF THE DISCLOSURE

A six layer semiconductor device wherein the first two layers have a smaller area than the layers beneath them. Cathode and anode electrodes are connected to exposed portion of the fourth layer and bottom layer, respectively, while gate electrodes are connected to the third and sixth layers, respectively, and to a common gate electrode. A control voltage having a first magnitude applied to the gate electrode will turn the device on between the anode and cathode electrodes, while a voltage of a second magnitude applied to the gate electrode will turn the device off.

This invention relates to switching devices, and more specifically relates to a novel controlled rectifier type device using a positive signal pulse of a first magnitude connected to the gate of the device for turning the device on, while a signal magnitude greater than the signal magnitude of the turn-on pulse will turn the device off.

Thus, the device can be switched between its ON and OFF conduction conditions without requiring reversal of voltage in the main power circuit.

Accordingly, a primary object of this invention is to provide a novel semiconductor device which can be switched between ON and OFF conditions.

Another object of this invention is to provide a novel semiconductor device which uses a positive pulse turn-on gate electrode.

Another object of this invention is to provide a novel semiconductor switching device which can be switched to conductive and non-conductive conditions responsive to various signal magnitudes of an input pulse.

These and other objects of this invention will become apparent from the following description when taken in connection with the drawings, in which.

Figure 1:
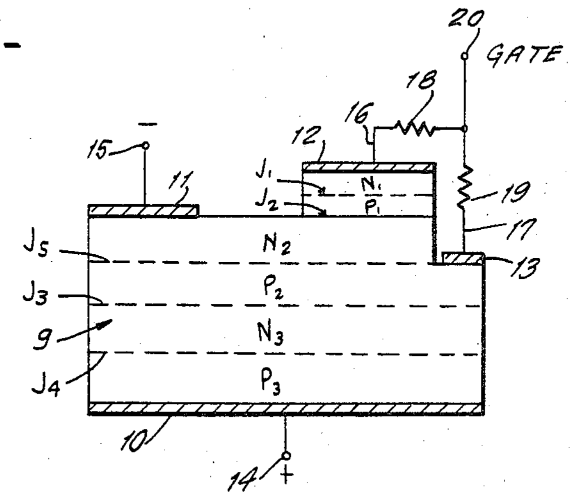
FIGURE 1 is a cross-sectional view of a typical semiconductor wafer constructed in accordance with the present invention.

Referring first to FIGURE 1, I have illustrated therein a semiconductor wafer 9 which has a bottom anode electrode 10, an upper cathode electrode 11, and a pair of gating electrodes 12 and 13. The cathode electrode 11 is connected to an upper N-type region $N_2$ which is placed atop a P-type region $P_2$ and is separated therefrom by a junction $J_5$. The P-type region $P_2$ is then atop an N-type region $N_3$ and is connected thereto along a junction $J_3$. N-type region $N_3$ is then placed atop a P-type region $P_3$ along a junction $J_4$ with the P-type region $P_3$ connected directly to anode electrode 10. A turn-off gate electrode 12 is then placed directly atop an N-type region $N_1$ which is atop P-type region $P_1$ creating junction $J_1$, the P-type region $P_1$ being atop the N-type region $N_2$ thus forming the final junction $J_2$. Thus, there will be five junctions in the device $J_1$ through $J_5$. A turn-on gate electrode 13 is then connected to P-type region $P_2$.

A common control terminal 20 is then provided which is connected to electrode 12 through resistor 18 and lead

16. Terminal 20 is similarly connected to electrode 13 through a resistor 19 in series with a conductor 17. The terminals of resistors 18 and 19 are then connected to the gate terminal 20, as shown.

Figure 2:
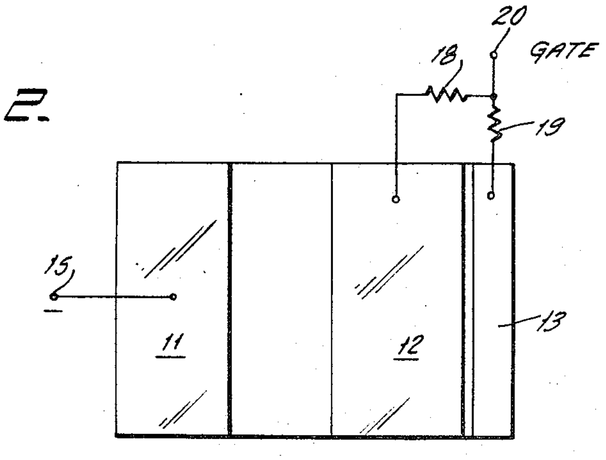
FIGURE 2 is a top view of FIGURE 1.

In the operation of the switching device of FIGURES 1 and 2, a positive gate signal applied to terminal 20 will turn the device on or to its conductive condition, whereby power flow can pass from terminal 14 to terminal 15. The signal used for causing turn-on of the device is made smaller than the breakdown voltage of junction $J_1$. In order to turn the device off, even though a positive potential appears at terminal 14 with respect to negative terminal 15, a positive signal which is greater than the breakdown voltage of junction $J_1$ is applied to terminal 20. When this occurs, holes will be injected into region $N_2$ through junction $J_2$.

This relatively high hole current will tend to lower the injection efficiency of $N_2$ at junction $J_5$, reducing electron injection from $N_2$ into $P_2$ and thereby reducing the main conduction current through the device to a level below the holding current.

If the region where the gate contact 13 is made is relatively remote from that portion of $N_2$ not overlaid by $P_1$ and $N_1$ and if the resistance of resistor 19 is sufficiently high in relation to resistance 18, the field acting upon $N_2$ which would tend to cause electron injection into $P_2$ would tend to be overcome by the fields set up tending to cause electron injection from $N_2$ into $P_1$. The IR drop transversely through the $P_2$ layer would contribute to reducing the effectiveness of the gate at 13 as opposed to the turn-off gate at 12, provided the positive pulse at 20 is sufficient to cause breakdown of $J_1$ and ample current through $J_1$ and $J_2$.

It is understood that if a separate contact is made at electrode 12, not connected to electrode 13, a suitable positive turn-off pulse can be applied at electrode 12 without electrode 13 being biased during this turn-off phase.

It is also understood that the turn-off signal must be of such a magnitude that the current through the device is reduced below its holding current.

If the positive pulse at electrode 12 is sufficiently large and if the area of junctions $J_1$ and $J_2$ are sufficiently large, and preferably are at least 75% of size of the area of junction $J_5$, then the device will be turned off.

In particular, and in accordance with the invention, the area of junctions $J_1$ and $J_2$ are .075 cm.$^2$ as contrasted to an area of .100 cm.$^2$ for junction $J_5$.

Figure 3:
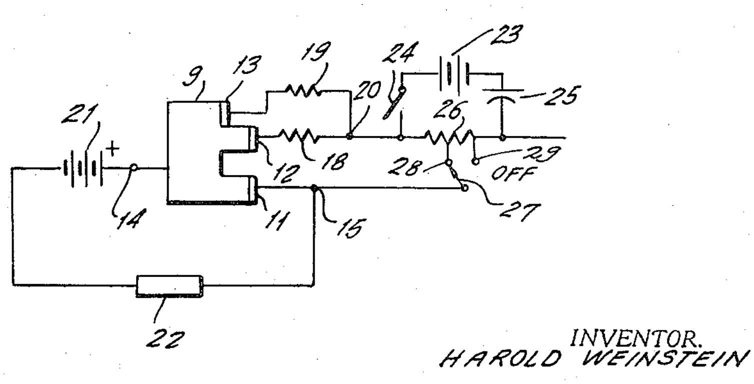
FIGURE 3 is a schematic circuit diagram of the manner in which the novel switching device can be incorporated into an electrical circuit.

FIGURE 3 illustrates the manner in which the novel switching device may be applied to an electrical circuit. Thus, in FIGURE 3, the main power circuit of semiconductor switch 9 is connected in series with a D-C voltage source 21 which has its positive terminal connected to anode electrode 14, while cathode terminal 15 is connected in series with load 22 and the negative terminal of source 21.

A control circuit for controlling the switching of the device and thus the application of power in source 21 to load 22 then includes a biasing battery 23 connected through a switch 24 and across the tapped resistor 26 and in series with capacitor 25. The lower terminal of switch 24 is then connected to terminal 20, while the cathode terminal 15 is connected to the movable switch arm 27 of a two-position switch having fixed contacts 28 and 29.

When the movable arm 27 is in the left-hand position shown, the closing of switch 24 will apply a positive voltage pulse to the gate terminal 20 which is sufficient to turn the device on. Note that the closing of switch 24 will cause battery 23 to charge capacitor 25, thereby generating a voltage pulse of a magnitude limited by the time constant of capacitor 25 and the resistance of the resistor 26 which is connected between terminals 15 and 20. Moreover, the voltage magnitude of this pulse will be relatively low since a relatively low resistance magnitude is used in the circuit.

In order to turn the device to its OFF condition, a higher magnitude voltage pulse is required, whereby connection of movable arm 27 to terminal 29 will place the full resistance 26 across terminals 15 and 20. Therefore, if operating switch 24 is now closed, a higher voltage pulse will appear across terminals 15 and 20, thereby to turn the device 9 off in the manner described above.

In a typical device, the following circuit components could be used in order to generate the desired pulse voltage magnitudes:

| | |
|---|---|
| Battery **21** ____________________________volts__ | 100 |
| Load **22** _______________________________ohms__ | 20 |
| Resistor: | |
| **18** _______________________________do____ | 10 |
| **19** _______________________________do____ | 200 |
| Capacitor **25** ___________________microfarads__ | .5 |
| Battery **23** ____________________________volts__ | 20 |

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A positive pulse turn-off controlled rectifier comprising a wafer of monocrystalline semiconductor material having a plurality of alternate zones of opposite conductivity types; a first layer of positive conductivity material extending across the bottom of said wafer; a second layer of negative conductivity type material extending above said first layer and defining a first junction; a third layer of positive conductivity material extending above said second layer and defining a second junction; a fourth layer of negative conductivity material extending above a portion of said third layer and defining a third junction; a fifth layer of positive conductivity material extending above a portion of said fourth layer and defining a fourth junction; a sixth layer of negative conductivity type material extending above said fifth layer and defining a fifth junction; a gate electrode connected to a third portion of said third layer, a cathode electrode connected to said fourth layer and an anode electrode connected to the bottom of said first layer.

2. The device as set forth in claim 1 which includes fourth electrode means connected to the upper surface of said sixth layer; and circuit means connecting said fourth electrode means to said gate electrode.

3. The device as set forth in claim 1 wherein the area of said fourth and fifth junctions is at least ¾ of the area of said third junction.

References Cited

UNITED STATES PATENTS

| | | | |
|---|---|---|---|
| 3,201,679 | 8/1965 | Buchanan __________ | 307—88.5 |
| 3,251,004 | 5/1966 | Shombert et al. ______ | 317—235 |

JOHN W. HUCKERT, *Primary Examiner.*

J. D. CRAIG, *Assistant Examiner.*